US008742562B2

(12) United States Patent
Mifsud

(10) Patent No.: US 8,742,562 B2
(45) Date of Patent: Jun. 3, 2014

(54) ELECTRONIC DEVICE PROTECTED AGAINST ELECTRO STATIC DISCHARGE

(75) Inventor: Anthony Mario Mifsud, Sta Venera (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 1283 days.

(21) Appl. No.: 12/512,112

(22) Filed: Jul. 30, 2009

(65) Prior Publication Data

US 2010/0025838 A1 Feb. 4, 2010

(30) Foreign Application Priority Data

Aug. 1, 2008 (IT) .............................. MI2008A1441

(51) Int. Cl.
*H01L 25/11* (2006.01)
(52) U.S. Cl.
USPC .................... 257/686; 257/E25.027; 438/106
(58) Field of Classification Search
USPC .................. 257/686, 690, E23.141, E25.027; 438/106; 324/754, 758
See application file for complete search history.

(56) References Cited

U.S. PATENT DOCUMENTS

| 4,724,473 | A | | 2/1988 | Lacruche |
| 5,701,085 | A | * | 12/1997 | Malladi et al. ........... 324/750.09 |
| 6,362,531 | B1 | * | 3/2002 | Stamper et al. ............... 257/781 |
| 7,893,547 | B2 | * | 2/2011 | Huang et al. .................. 257/787 |
| 2002/0105064 | A1 | | 8/2002 | Lin et al. |

FOREIGN PATENT DOCUMENTS

| DE | 19945426 | 1/2001 |
| JP | 58071644 | 4/1983 |

OTHER PUBLICATIONS

European Search Report for Application No. EP09167061, European Patent Office, Munich, Dec. 10, 2009.
James E Vinson and J. J. Liou: "Electrostatic Discharge in Semiconductor Devices: Protection Techniques", Proceedings of the IEEE, vol. 88, No. 12, Dec. 2000, pp. 1878-1900.
Lonnie Brown, Dan Burns, Smith Brown & Associates, Glendale, Calif: "The ESD Control Process is a Tool for Managing Quality", Electronic Packaging and Production, Apr. 1990, pp. 50-53.

* cited by examiner

*Primary Examiner* — Roy Potter
(74) *Attorney, Agent, or Firm* — Graybeal Jackson LLP

(57) ABSTRACT

An embodiment of a method for manufacturing an electronic device realized on a semiconductor substrate and protected against electro static discharge by the provision of supporting means for the electronic device to keep it far from contacts with possible sources of an ESD event during the manufacturing phases. The supporting means are associated with said electronic device in all the manufacturing stages for instance when assembling the device, when picking and placing it in trays a first time, during the burning-in testing phases, when picking and placing it in trays a second time, or when picking and placing it in a scanner. In an embodiment, the supporting means are protective notches associated with the back side of the semiconductor substrate and provided at each edge corner of the semiconductor substrate.

40 Claims, 3 Drawing Sheets

ELECTRONIC DEVICE PROTECTED AGAINST ELECTRO STATIC DISCHARGE

PRIORITY CLAIM

The present application claims the benefit of Italian Patent Application Serial No.: MI2008A001441, filed Aug. 1, 2008, which application is incorporated herein by reference in its entirety.

TECHNICAL FIELD

An embodiment of the present disclosure relates to a method for manufacturing an electronic device protected against electro static discharge (ESD).

An embodiment of the disclosure also relates to an electronic device protected against electro static discharge (ESD).

An embodiment of the disclosure particularly, but not exclusively, relates to a class zero device and other such ESD sensitive devices, for instance such as Ball Grid Array (BGA) packages or Quad Flat No-Lead (QFN) packages, and the following description refers to this application field only to simplify the explanation.

BACKGROUND

As it is well known, the trend in the semiconductor world is that as electronic devices become smaller and faster, they inevitably become more sensitive to electro static discharge (ESD).

In particular, typically the most ESD sensitive devices are class zero devices, which can resist ESD events of less than 250 Volts (V). After assembly, a class zero device goes through many handling stages and each stage comes with its own threats of ESD event occurrence. For example, if the electric contacts of a charged device touch another material or object that is not ESD safe, at any stage from assembly stage to testing and packing stage, there is a good possibility for the device to be damaged by an ESD event. Likewise, if an uncharged device touches a surface or object which is not sufficiently grounded, an ESD event and resulting damage is probable.

It is also well known that the Ball Grid Array (BGA) is a kind of package which is very prone to ESD events. FIG. 1A shows a BGA package 1 comprising a substrate 2 including a plurality N of electric contacts realized on its surface and comprising copper pads 3a connected to solder balls 3b. As it appears from the top view of the BGA package/shown in FIG. 1B, the solder balls are completely exposed, causing the package to be susceptible to ESD events and physical damage. In fact, a substantial percentage of the final yield loss in BGA is due to physical defects on the balls such as squashed, dented, sheared, and missing balls. As an example, the finishing stage alone results in an average yield loss of 0.25% on otherwise good parts.

In addition, after assembly, the ESD sensitive BGA package goes through many handling stages, and each stage comes with its own threats of ESD event occurrence.

The ESD effect is also present in a Quad Flat No-Lead (QFN) package. As shown in FIG. 2A, a QFN package 11 comprises a substrate 12 having on its back surface a plurality N of electric contacts comprising contact pads 13 without solder balls. So, the contacts are typically less prone than the contacts in a BGA package to physical damage. Nevertheless, the pads of the QFN package are still exposed, and thus the QFN package is typically as susceptible to ESD damage as the BGA package.

Many techniques to reduce the impact of ESD on devices have been implemented. At present, a lot of investment, resources, and time are utilized to avoid the occurrence of such damages. For example it is recommended that new, expensive ESD-safe floor mats be installed everywhere a device will be handled, ionizers should be installed in the environment where the devices are handled, and all personnel in charge of the manufacturing of the device should wear heel straps and wrist straps. Furthermore, trays and all material which could come in contact with the devices, and even material which could not come in contact but could be a short distance away (and thus be capacitively coupled to a device), should be ESD safe and properly grounded.

Nevertheless there are still some problems in implementing such safe measures due to the fact that ESD safe material is very expensive, and requires regularly scheduled checking and maintenance. Some ESD dissipative materials also have a finite lifetime and must be changed periodically.

ESD damage affects production yields, product quality, reliability and profitability, and manufacturing costs. It has been estimated in an article: "The ESD Control Process is a Tool for Managing Quality", *Electronic Packaging and Production*, April 1990, pp 50-53, which is incorporated by reference, that the actual cost of ESD damage to the electronic industry runs into billions of dollars annually when including the associated costs of repair and rework, shipping, labor, and overhead.

Several solutions are known in the prior art to reduce the ESD events, but they are all based on modifying and monitoring the device's environment during all manufacturing processes. These solutions however, may be relatively complex, unreliable, and unmanageable, and the devices for which these solutions are applied may still be prone to ESD damage.

SUMMARY

An embodiment of the present disclosure is a method for manufacturing an electronic device protected against electro static discharge (ESD), having structural and functional features that allow the method to realize such a device with relatively low cost and with more reliable and manageable manufacturing processes, thus overcoming the limitations and/or the drawbacks of the known electronic devices and methods for processing these devices.

An embodiment of the present disclosure is a method for manufacturing an electronic device protected against electro static discharge (ESD) by using a protected package.

In an embodiment, a method for manufacturing an electronic device is realized on a semiconductor substrate protected against electro static discharge (ESD), comprising providing supporting means for said electronic device to keep it far from contacts with possible sources of an ESD event during the manufacturing phases.

Moreover, said supporting means may be associated with said electronic device in the stages of:
assembling said device, picking and placing the device in trays a first time, burning-in or testing said electronic device, picking and placing it in trays a second time, and picking and placing it in a scanner.

In an embodiment, said supporting means are protective notches associated with the back side of said semiconductor substrate and provided at each edge corner of said semiconductor substrate.

An embodiment of the inventive method includes the further step of finishing said electronic device by nipping off said protective notches before the packing phase.

In an embodiment, an electronic device is realized on a semiconductor substrate and protected against electro static discharge, and includes supporting means associated with the back side or surface of said semiconductor substrate to keep said electronic device far from contacts with possible sources of an ESD event during the manufacturing phases.

BRIEF DESCRIPTION OF THE DRAWINGS

Features and the advantages of a method and device according to one or more embodiments of the disclosure will be evident from the following description, which is purely indicative and not limitative, and which refers to the attached drawings.

DETAILED DESCRIPTION

Figure 1A:
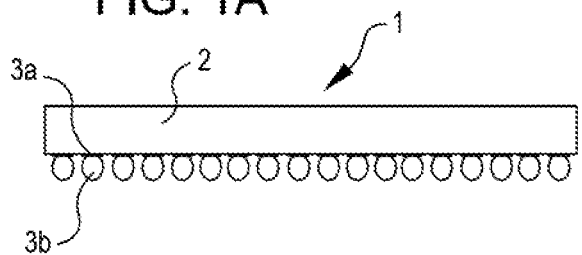
FIG. 1A is a cross-sectional view of a BGA package according to the prior art.
Figure 1B:
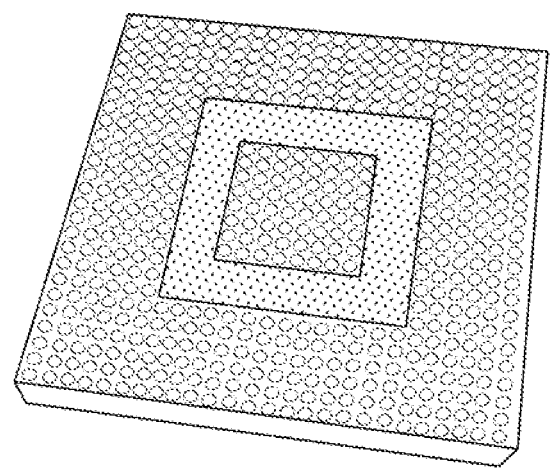
FIG. 1B is a top view of a BGA package according to the prior art.
Figure 2A:
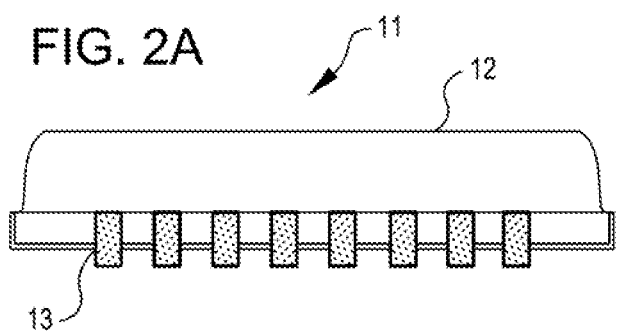
FIG. 2A is a cross-sectional view of a QFN package according to the prior art.
Figure 2B:
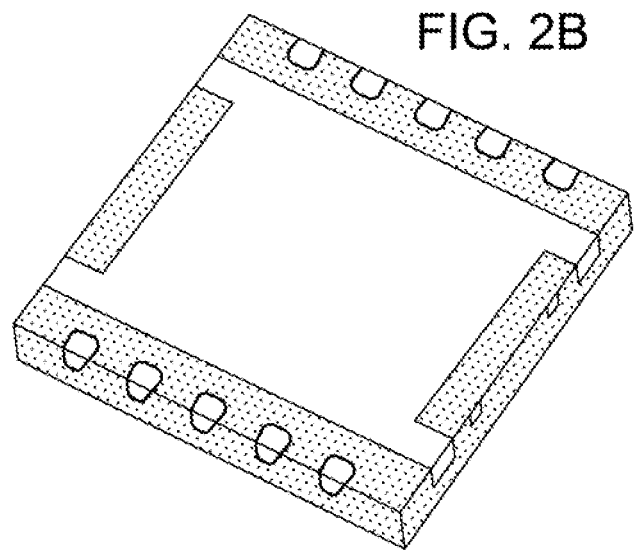
FIG. 2B is a top view of a QFN package according to the prior art.
Figure 3A:
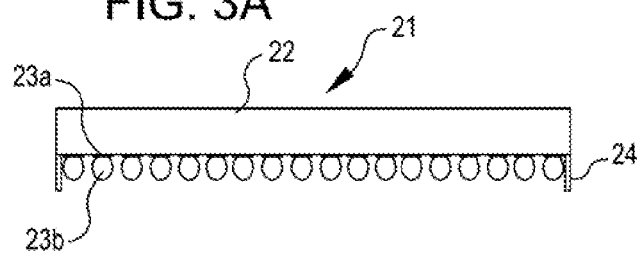
FIG. 3A is a cross-sectional view of a protected BGA package according to an embodiment of the disclosure.
Figure 3B:
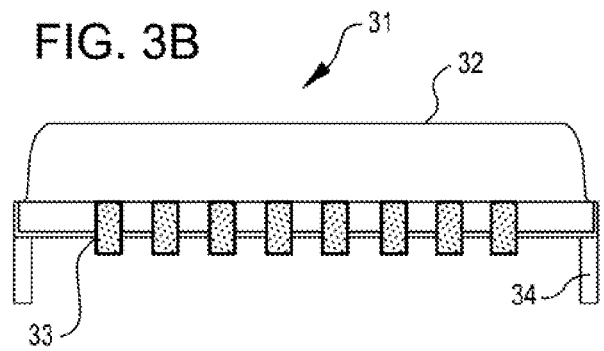
FIG. 3B is a cross-sectional view of a protected QFN package according to an embodiment of the disclosure.

Referring specifically to FIGS. 3A and 3B, a cross section of a protected BGA package 21 and a cross section of a protected QFN package 31 are shown, respectively, according to an embodiment.

Figure 4A:
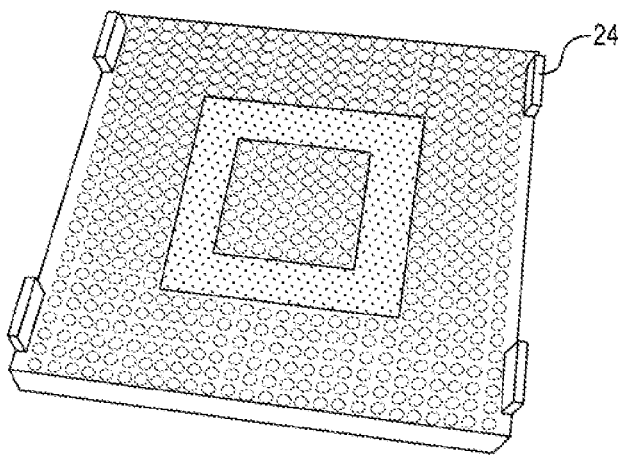
FIG. 4A is a top view of a protected BGA package according to an embodiment of the disclosure.

The BGA package 21 (FIG. 3A) comprises a silicon substrate 22 including on its back surface a plurality N of electric contacts comprising copper pads 23a connected or associated with solder balls 23b. In this package, protective notches 24 are realized at each edge of the silicon substrate 22. From a top view of the package 21, shown in FIG. 4A, it's evident that the number of protective notches 24 used in this embodiment are four.

The protective notches 24 may be considered support pins of the BGA package for keeping the solder balls 23b out of contact with any object that could interfere with them and provide a possible ESD problem.

Figure 4B:
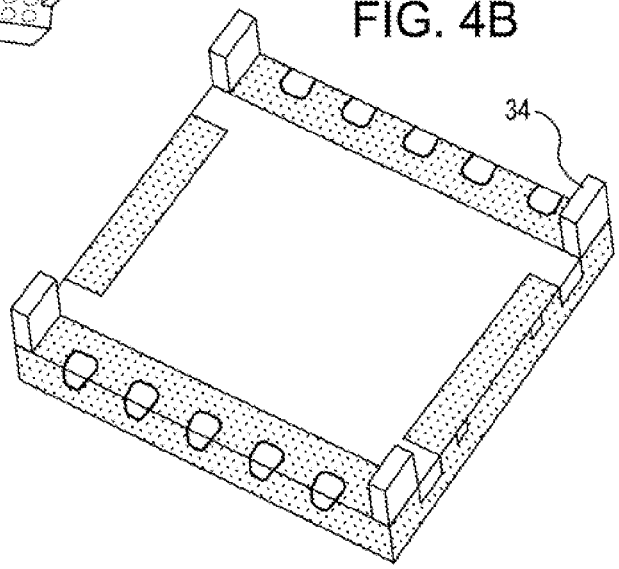
FIG. 4B is a top view of a protected QFN package according to an embodiment of the disclosure.

Coming now to FIG. 3B, the QFN package 31 comprises a silicon substrate 32 and a plurality N of electric contacts 33 without solder balls. According to an embodiment of the disclosure, some protective notches 34 are provided at each edge corner of the silicon substrate 32, as also shown in FIG. 4B.

IN this example, four protective notches 34 are provided as support pins for the QFN package.

These two protected packages 21 and 31 thus comprise protection respectively for the balls and for the contacts from physical contact with other material, greatly decreasing the possibility of an ESD event to occur.

Figure 5A:
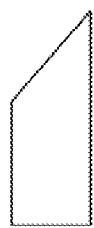
FIG. 5A is a schematic view of an embodiment for realizing a protected package.
Figure 5B:
FIG. 5B is schematic view of another embodiment for realizing a protected package.

The protective notches 24 and 34 may be realized with an end having a tapered shape and/or a lateral tip, as shown in FIG. 5A, or a central tip, as shown in FIG. 5B. This shape allows the notches 24 or 34 to act as guiding pins, improving alignment with the contact site at testing stage, for example. As a consequence, the contact quality is improved and the possibility of damaging the solder balls of a BGA package at this stage is very much reduced. In fact, the solder balls go through a lot of stresses during testing because they are placed in a test socket many times: e.g., at Burn—in, at first test, at second test, at Recycle, at QC1 ($1^{st}$ Quality Check) and at QC2 ($2^{nd}$ Quality Check).

In an embodiment, the dimensions of the notches are as small as can be for supporting the weight of the device.

Figure 6:
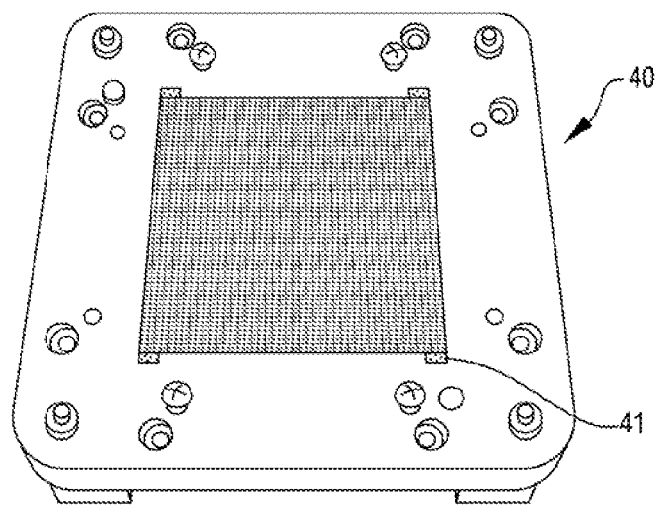
FIG. 6 is a view of a specific test socket for a protective package according to an embodiment of the disclosure.

According to an embodiment of the disclosure, a specific test socket 40 is used for the testing of the packages. This testing socket 40 comprises rectangular holes 41 acting as sockets for the notches 24 or 34, according to which package is to be tested. These rectangular holes 41 are shown in FIG. 6.

Figure 7A:
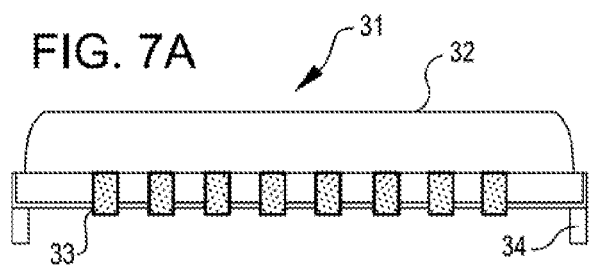
FIGS. 7A, 7B and 7C are corresponding process steps to realize an ESD protected electronic device using a protective package according to an embodiment of the disclosure.

An electronic device protected against ESD is thus realized using the protected packages 21 and 31 encapsulating it during its manufacturing phases. As an example, in FIGS. 7A, 7B and 7C the protected package 31 is used during the manufacturing of the device. In FIG. 7A is shown the protected package 31 used during the stages of assembly, for instance: pick and place in trays a first time, burn-in phase, testing (multiple pick and place in handler), pick and place in trays a second time, and pick and place in a scanner.

Figure 7B:
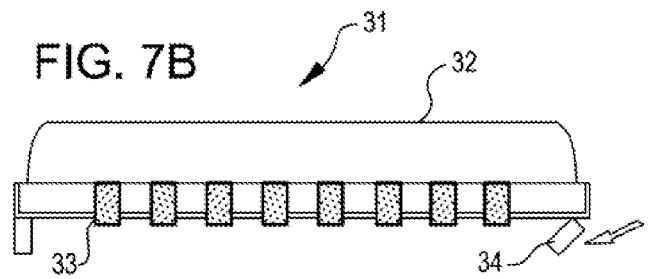

After these phases or stages, a finishing stage, shown in FIG. 7B, is implemented. During this stage the protective notches 34 are nipped off by a mechanical system suitable for nipping off the notches.

In an embodiment, this nipping off of the notches is done before the devices are place in a customer tray or tape, thereby not requiring any investment or process alteration in the customer is process.

Figure 7C:
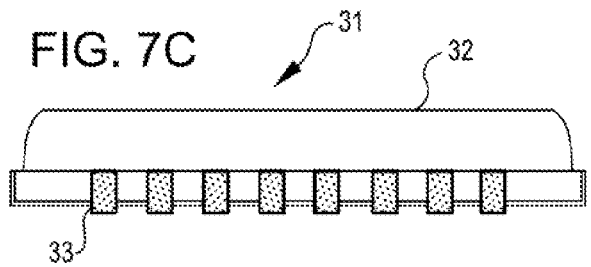

Referring to FIG. 7C, a final stage is testing during which it has been evaluated, that with an embodiment of the disclosure, a yield loss due to physical damage of a BGA package is less than 0.25%.

In conclusion, a device according to an embodiment of the disclosure is much less susceptible to ESD events and to physical damage to the contacts than are prior devices.

Using a device according to an embodiment of the disclosure it may also be possible to reduce the monitoring of the process stages because of the reliability of the device, which does not depend on human activities.

Moreover, the final yield and the quality of the final product may be increased and, as a consequence, the price per unit may be reduced.

Furthermore, a device according to an embodiment of the disclosure may be coupled to one or more other integrated circuits, such as a processor, controller, or memory, to form a system. Or, the device may be a system on a chip (SOC).

In addition, although the notches 24 and 34 are shown disposed along a periphery of the integrated-circuit surface, one or more of the notches may be located inward of the periphery.

Moreover, an integrated circuit may have more or fewer than four notches.

Furthermore, although described as being removed after the manufacturing process but before sale to customers, the notches may remain installed even after sale to customers so as to continue to provide ESD protection. A customer may remove the notches at a time of his choosing, e.g., prior to installation of the integrated circuit on a printed circuit board.

In addition, although the notches 24 and 34 are discussed in conjunction with BGA and QFN packages, these or similar notches may be disposed on other types of packages.

Naturally, in order to satisfy local and specific requirements, a person skilled in the art may apply to the embodiments described above many modifications and alterations. Particularly, although one or more embodiments have been described with a certain degree of particularity, it should be understood that various omissions, substitutions, and changes in the form and details as well as other embodiments are possible. Moreover, it is expressly intended that specific elements and/or method steps described in connection with any disclosed embodiment may be incorporated in any other embodiment as a general matter of design choice.

The invention claimed is:

1. Electronic device realized on a semiconductor substrate, comprising supporting structures disposed on said semiconductor substrate to keep said electronic device far from contacts with possible sources of an ESD event such that the supporting structures extend a first distance from the semiconductor substrate; and the contacts extend a second distance from the semiconductor substrate, the second distance being less than one half of the first distance.

2. Electronic device realized on a semiconductor substrate, comprising supporting structures disposed on said semiconductor substrate to keep said electronic device far from contacts with possible sources of an ESD event;
the electronic device further comprising a plurality N of electric contacts on said back surface and wherein supporting structures are protective notches provided at each edge corner of said silicon substrate.

3. Electronic device realized on a semiconductor substrate, comprising supporting structures disposed on said semiconductor substrate to keep said electronic device far from contacts with possible sources of an ESD event;
wherein said package is a ball grid array package.

4. Electronic device according to claim 1 wherein said package is a quad flat no-lead package.

5. Electronic device according to claim 2 wherein said electric contacts comprise a plurality of copper pads and a plurality of solder balls connected to said copper pads.

6. Electronic device according to claim 2 wherein said electric contacts are contact pads.

7. Electronic device according to claim 2 wherein said protective notches protect said solder balls from physical contact with another material or object.

8. Electronic device according to claim 6 wherein said protective notches protect said contact pads from physical contact with another material.

9. Electronic device according to claim 2 wherein there are four of said protective notches.

10. Electronic device according to claim 2 wherein said protective notches have an end with a tapered shape.

11. An integrated-circuit package, comprising:
a surface of an integrated circuit;
at least one conductive contact disposed on the surface;
a plurality of contacts disposed on an opposite surface of the integrated circuit; and
at least one support member disposed on and extending from the surface farther than the at least one conductive contact extends from the surface.

12. An integrated-circuit package, comprising:
a surface;
at least one conductive contact disposed on the surface; and
at least one support member disposed on and extending from the surface farther than the at least one conductive contact extends from the surface;
wherein the at least one conductive contact comprises a conductive ball.

13. The package of claim 11 wherein the at least one conductive contact is substantially flat.

14. The package of claim 11 wherein:
the at least one support member extends a first distance from the surface; and
the at least one conductive contact extends a second distance from the surface, the second distance being less than one half of the first distance.

15. An integrated-circuit package, comprising:
a surface;
at least one conductive contact disposed on the surface; and
at least one support member disposed on and extending from the surface farther than the at least one conductive contact extends from the surface;
wherein:
the at least one support member extends a first distance from the surface; and
the at least one conductive contact extends a second distance from the surface, the second distance being greater than one half of the first distance.

16. The package of claim 11 wherein the at least one support member is nonconductive.

17. An integrated-circuit package, comprising:
a surface;
at least one conductive contact disposed on the surface; and
at least one support member disposed on and extending from the surface farther than the at least one conductive contact extends from the surface;
wherein the at least one support member has an angled end.

18. An integrated-circuit package, comprising:
a surface;
at least one conductive contact disposed on the surface; and
at least one support member disposed on and extending from the surface farther than the at least one conductive contact extends from the surface;
wherein the at least one support member has a pointed end.

19. The package of claim 11 wherein the at least one support member has a substantially flat end.

20. The package of claim 11, further comprising:
multiple conductive contacts disposed on the surface; and
wherein the at least one support member extends from the surface farther than each of the conductive contacts extends from the surface.

21. The package of claim 11, further comprising multiple support members that each extend from the surface farther than the at least one conductive contact extends from the surface.

22. An integrated-circuit package, comprising:
a surface;
at least one conductive contact disposed on the surface; and
at least one support member disposed on and extending from the surface farther than the at least one conductive contact extends from the surface;
wherein:
the surface comprises a periphery; and
the at least one support member is disposed substantially along the periphery.

23. The package of claim 11 wherein:
the surface comprises a periphery; and
the at least one support member is disposed remote from the periphery.

24. An integrated circuit, comprising:
a package exposing a surface of an integrated circuit;
at least one conductive contact disposed on the surface;
a die disposed in the package and having a circuit node that is coupled to the at least one conductive contact; and
at least one support member disposed on and extending from the surface farther than the at least one conductive contact extends from the surface.

25. A system, comprising:
a first integrated circuit having a first die disposed within a first package, exposing a surface of an integrated circuit;
at least one conductive contact disposed on the surface; and
at least one support member disposed on and extending from the surface farther than the at least one conductive contact extends from the surface; and
a second integrated circuit having a second die disposed within a second package and coupled to the first integrated circuit.

26. The system of claim 25 wherein one of the first and second integrated circuits comprises a controller.

27. A test fixture, comprising:
a surface;
at least one test node disposed adjacent to the surface; and
at least one non-signal receptacle that opens through the surface;
wherein the at least one receptacle is configured to align the test node with the at least one conductive contact while the at least one support member is disposed within the receptacle.

28. The test fixture of claim 27 wherein the surface is substantially flat.

29. The test fixture of claim 27 wherein the test node is conductive.

30. The test fixture of claim 27 wherein the test node is disposed on the surface.

31. The test fixture of claim 27 wherein the test node is disposed substantially at surface level.

32. A test fixture, comprising:
a surface;
at least one test node disposed adjacent to the surface; and
at least one non-signal receptacle that opens through the surface;
wherein the test node is disposed below the surface.

33. The test fixture of claim 27 wherein the receptacle is deeper from the surface than the test node.

34. A test fixture, comprising:
a surface;
at least one test node disposed adjacent to the surface; and
at least one non-signal receptacle that opens through the surface;
wherein:
the at least one test node is configured to communicate with at least one conductive contact disposed on a surface of an integrated-circuit package; and
the at least one receptacle is configured to receive at least one support member that is disposed on and extending from the surface of the package farther than the at least one conductive contact extends from the surface of the package.

35. A test fixture, comprising:
a surface;
at least one test node disposed adjacent to the surface; and
at least one non-signal receptacle that opens through the surface;
wherein the test node is conductive and is configured to contact the at least one conductive contact while the at least one support member is disposed within the receptacle.

36. A method, comprising:
forming at least one conductive contact on a surface of an integrated-circuit; and
forming at least one support member that extends from the surface farther than the at least one conductive contact extends from the surface.

37. The method of claim 36, further comprising:
placing an integrated-circuit die within the package; and
sealing the package.

38. A method, comprising:
placing adjacent to a first surface an integrated circuit having a second surface and having at least one conductive contact disposed on the second surface; and
separating the at least one conductive contact from the first surface with at least one support member having a first end that is in contact with the first surface and having a second end that is attached to the second surface.

39. The method of claim 38, further comprising:
moving the integrated circuit away from the first surface; and
removing at least a portion of the at least one support member from the integrated circuit.

40. The method of claim 38, further comprising:
moving the integrated circuit away from the first surface; and
detaching the at least one support member from the integrated circuit at a location that is substantially level with the second surface.

* * * * *